(12) United States Patent
Schutten et al.

(10) Patent No.: US 9,974,201 B1
(45) Date of Patent: May 15, 2018

(54) HIGH POWER FEEDTHROUGH FOR USE WITH A HIGH FREQUENCY POWER CONVERTER

(71) Applicant: General Electric Company, Schenectady, NY (US)

(72) Inventors: Michael Joseph Schutten, Rotterdam, NY (US); Robert James Thomas, Rexford, NY (US); Maja Harfman Todorovic, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days. days.

(21) Appl. No.: 15/337,841

(22) Filed: Oct. 28, 2016

(51) Int. Cl.
| | | |
|---|---|---|
| *H05K 1/14* | (2006.01) | |
| *H05K 5/02* | (2006.01) | |
| *H01B 17/26* | (2006.01) | |
| *H05K 7/14* | (2006.01) | |
| *H05K 1/16* | (2006.01) | |
| *H05K 1/02* | (2006.01) | |

(52) U.S. Cl.
CPC ......... *H05K 5/0247* (2013.01); *H01B 17/265* (2013.01); *H05K 1/0243* (2013.01); *H05K 1/0296* (2013.01); *H05K 1/162* (2013.01); *H05K 1/167* (2013.01); *H05K 7/1402* (2013.01); *H05K 7/1427* (2013.01); *H05K 2201/09036* (2013.01); *H05K 2201/0999* (2013.01)

(58) Field of Classification Search
CPC .. H01B 17/265; H05K 5/0247; H05K 1/0243; H05K 1/0296; H05K 1/162; H05K 1/167; H05K 7/1402; H05K 7/1427; H05K 2201/09036; H05K 2201/0999

USPC .......................................................... 361/738
See application file for complete search history.

(56) References Cited

U.S. PATENT DOCUMENTS

| | | | |
|---|---|---|---|
| 4,148,003 A | | 4/1979 | Colburn et al. |
| 4,928,138 A | * | 5/1990 | Walton .................. H01F 27/085 |
| | | | 336/69 |
| 4,935,842 A | | 6/1990 | Carlson et al. |
| 5,032,692 A | * | 7/1991 | DeVolder ............... H01G 2/103 |
| | | | 174/50.56 |
| 5,552,976 A | | 9/1996 | Munro et al. |
| 5,661,390 A | | 8/1997 | Lipo et al. |

(Continued)

FOREIGN PATENT DOCUMENTS

| | | |
|---|---|---|
| CN | 203278641 U | 11/2013 |
| CN | 204030937 | 12/2014 |
| WO | 2016039414 A1 | 3/2016 |

OTHER PUBLICATIONS

Zhong et al., "Improvements in EMC performance of inverter-fed motor drives", IEEE Transactions on Industry Applications, vol. 31, Issue: 6, pp. 1247-1256, Nov./Dec. 1995.

(Continued)

*Primary Examiner* — Hung S Bui
(74) *Attorney, Agent, or Firm* — Nitin N. Joshi

(57) ABSTRACT

A feedthrough includes a flange comprising an inner cylindrical surface and a planar mounting surface. The inner cylindrical surface defines a cylindrical passage within the flange. The feedthrough further includes a printed circuit board ("PCB") mounted on the planar mounting surface of the flange, and an electrically conductive element that extends through the cylindrical passage of the flange.

20 Claims, 5 Drawing Sheets

(56) References Cited

U.S. PATENT DOCUMENTS

| | | | |
|---|---|---|---|
| 5,896,267 A * | 4/1999 | Hittman | A61N 1/3754 |
| | | | 29/25.42 |
| 6,643,903 B2 | 11/2003 | Stevenson et al. | |
| 7,525,825 B2 | 4/2009 | Korich et al. | |
| 2004/0163836 A1* | 8/2004 | Kumar | H01S 5/02212 |
| | | | 174/50 |
| 2005/0195048 A1 | 9/2005 | Van Hoyweghen III et al. | |
| 2010/3002702 | 12/2010 | Fauer et al. | |
| 2011/0234096 A1* | 9/2011 | Asmussen | H05B 41/042 |
| | | | 315/53 |
| 2012/0261826 A1* | 10/2012 | Kuo | H01L 21/76898 |
| | | | 257/774 |
| 2012/0293910 A1* | 11/2012 | Kauffman | H01G 4/35 |
| | | | 361/302 |
| 2016/0148745 A1 | 5/2016 | Tanimizu et al. | |
| 2017/0012593 A1 | 1/2017 | Tanimizu et al. | |

OTHER PUBLICATIONS

I Cadirci et al., "Practical EMI-filter-design procedure for high-power high-frequency SMPS according to MIL-STD 461", IEE Proceedings—Electric Power Applications, vol. 152, Issue: 4, pp. 775-782, Jul. 2005.

Degano Marco, "EMI filter design for matrix converters in airspace applications", The University of Nottingham, 2012.

PCT Search Report and Written Opinion issued in connection with corresponding PCT Application No. PCT/US2017/053523 dated Dec. 15, 2017.

* cited by examiner

HIGH POWER FEEDTHROUGH FOR USE WITH A HIGH FREQUENCY POWER CONVERTER

BACKGROUND

The field of the disclosure relates generally to radio frequency (RF) feedthroughs, and more particularly, to a high power feedthrough for use with a high frequency power electronics system.

At least some feedthroughs are used in large-scale power electronics systems to conduct electrical current from a power source, through an enclosure, to a system within the enclosure. In particular, some feedthroughs are used to conduct electrical current from a photovoltaic ("PV") array, through a cabinet, to a power inverter housed within the cabinet. Within the cabinet, the power inverter converts direct current to alternating current, direct current to direct current, alternating current to direct current, or alternating current to alternating current, for use as electrical power.

Many known power inverters include fast switching semiconductor switching elements, such as silicon carbide ("SiC") and gallium nitride switching element. Such fast switching semiconductor switching elements are capable of reducing switching losses, allowing increased switching frequency, and so afford an advantage over more conventional power inverters. However, the faster switching transitions and larger switching frequency of fast switching power inverters may result in the production of undesirable high frequency electromagnetic energy, which may flow back over a power line, and other structures connecting to the PV array, causing the power line to act as an unintentional antenna transmitter.

BRIEF DESCRIPTION

In one aspect, a feedthrough is provided. The feedthrough includes a flange comprising an inner cylindrical surface and a planar mounting surface. The inner cylindrical surface defines a cylindrical passage within the flange. The feedthrough further includes a printed circuit board ("PCB") mounted on the planar mounting surface, and an electrically conductive element that extends through the cylindrical passage.

In another aspect, an electrical power generation system is provided. The electrical power generation system includes a power source, a power line coupled to the power source, a housing, a power inverter mounted within the housing, and a feedthrough that passes through the housing and that electrically couples the power line to the power inverter. The feedthrough includes a flange comprising an inner cylindrical surface and a planar mounting surface. The inner cylindrical surface defines a cylindrical passage within the flange. The feedthrough further includes a PCB mounted on the planar mounting surface, and an electrically conductive element that extends through the cylindrical passage.

In another aspect, a PCB for use as part of a feedthrough is provided. The PCB includes a first electrically conductive ring having a first radius, a second electrically conductive ring having a second radius that is greater than the first radius, and a third electrically conductive ring having a third radius that is greater than the second radius. The PCB further includes a first plurality of capacitors electrically coupled between the first electrically conductive ring and the second electrically conductive ring, and a second plurality of capacitors electrically coupled between the second electrically conductive ring and the third electrically conductive ring.

DRAWINGS

These and other features, aspects, and advantages of the present disclosure will become better understood when the following detailed description is read with reference to the accompanying drawings in which like characters represent like parts throughout the drawings, wherein.

Figure 1:
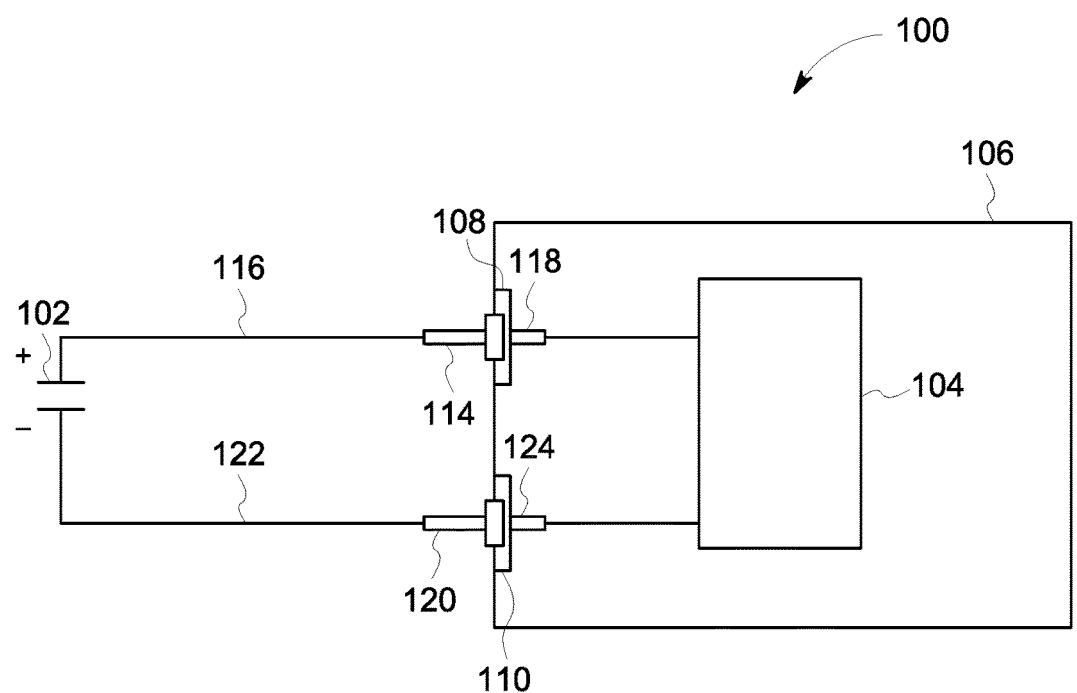
FIG. 1 is a block diagram of an exemplary power conversion system including a feedthrough.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to a high voltage and high current feedthrough. In general, direct current is generated by a photovoltaic ("PV") array and flows through a power line to the feedthrough. At the feedthrough, the electrical current is passed through a cabinet that houses a fast switching power converter, such as a silicon carbide ("SiC") or gallium nitride power inverter. The fast switching power inverter converts the direct current to alternating current. In the process, however, high frequency noise is generated. The high frequency noise flows back into the feedthrough, where it is shunted to ground through a plurality of capacitors mounted on a printed circuit board ("PCB") of the feedthrough. Thus, the feedthrough significantly reduces the flow of high frequency noise onto the power line coupling the feedthrough to the PV array, and, in turn, reduces the ability of this line to act as an unintentional antenna transmitter. The feedthrough further facilitates transmission of the high power DC signal to the fast switching power inverter.

Although generally described herein with respect to a photovoltaic array ("PV array"), the systems described herein are applicable to any type of electric generation system including, for example, solar power generation systems, wind turbines, fuel cells, geothermal generators, hydropower generators, and/or other devices that generate power from renewable and/or non-renewable energy sources.

FIG. 1 is a perspective view of an exemplary electrical power generation system 100. Electrical power generation system 100 includes a power source 102, a power converter, such as a power inverter 104, a cabinet 106, a first feedthrough 108, and a second feedthrough 110.

Power source 102 includes a power source, such as a PV array and/or any other suitable electric generation system. Power source 102 thus collects solar energy and converts the collected solar energy to electrical energy. Specifically, power source 102 converts solar energy to direct current.

Power inverter 104 converts the direct current to alternating current. More particularly, power inverter 104 includes one or more power semiconductor switching elements (not shown) and converts direct current, through the switching action of the one or more semiconductor switching elements, to alternating current. Power inverter 104 may generate unintentional high frequency noise as a byproduct.

Cabinet 106 is a protective enclosure for power inverter 104. Cabinet 106 is electrically grounded and includes an electrically conductive material, such as a particular metal or an alloy of several metals.

First feedthrough 108 and second feedthrough 110 are electrical feedthroughs (as described below with reference to FIG. 2). First feedthrough 108 is electrically coupled at a first end 114 to power source 102 through a power line 116. First feedthrough 108 is electrically coupled at a second end 118 to power inverter 104. Similarly, second feedthrough 110 is electrically coupled at a first end 120 to power source 102 through a power line 122. Second feedthrough 110 is further electrically coupled at a second end 124 to power inverter 104.

Figure 2:
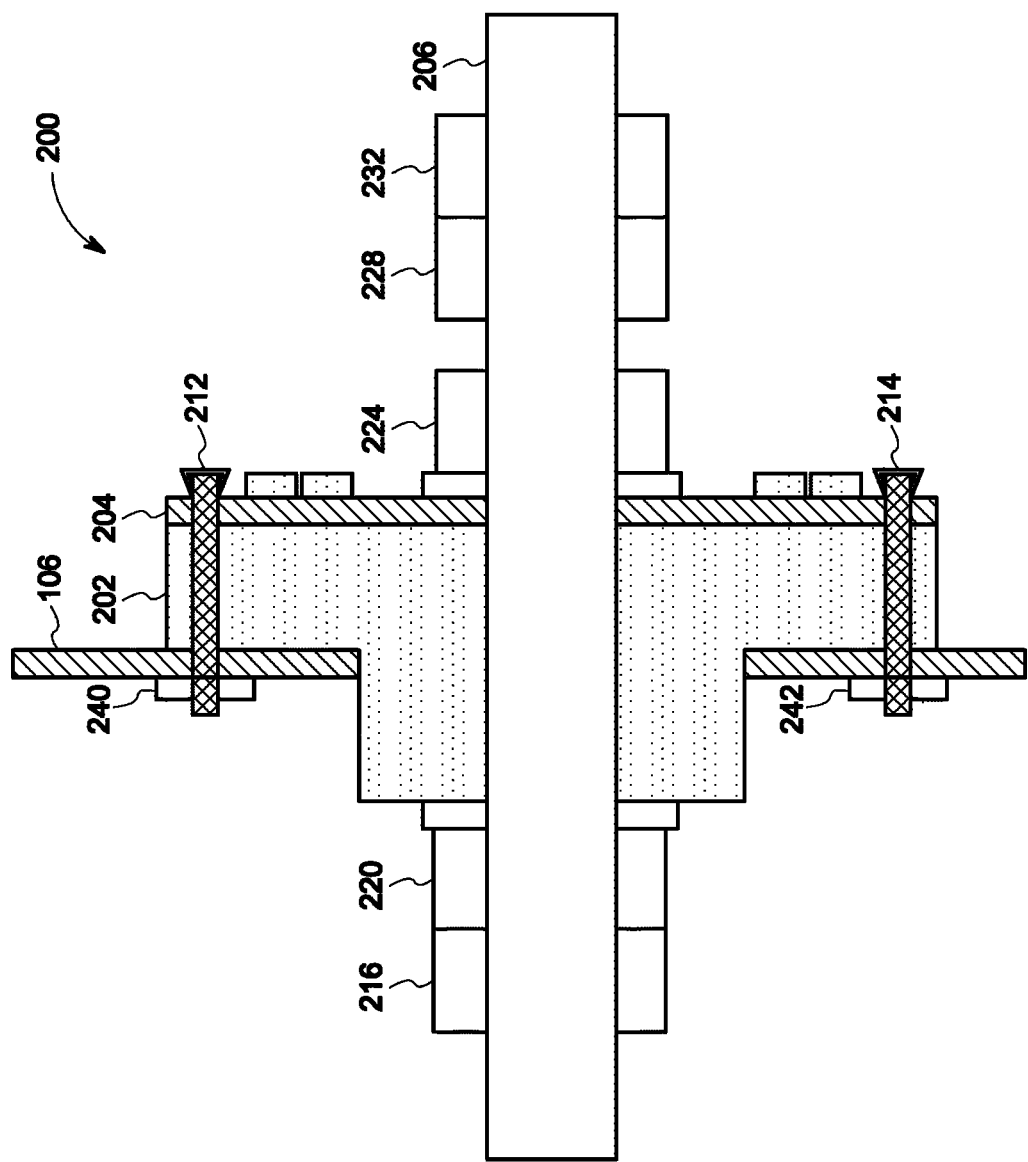
FIG. 2 is a cross-sectional view of the feedthrough shown in FIG. 1.

FIG. 2 is a cross-sectional view of an exemplary feedthrough 200, such as first feedthrough 108 or second feedthrough 110. Feedthrough 200 includes a flange 202, a printed circuit board ("PCB") 204, and an electrically conductive element 206, such as an elongated electrically conductive element.

Figure 3:
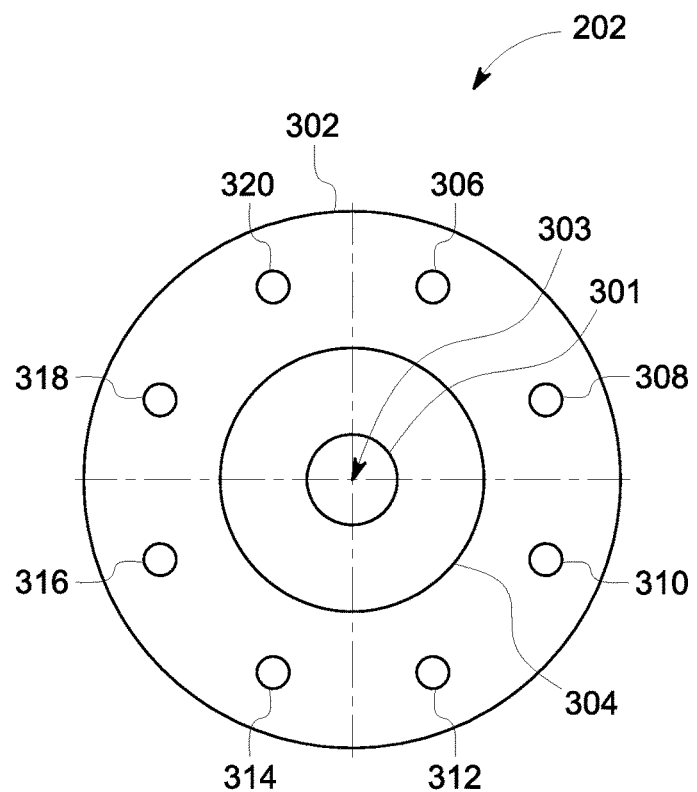
FIG. 3 is a top view of an exemplary flange that may be used with the feedthrough shown in FIG. 2.
Figure 4:
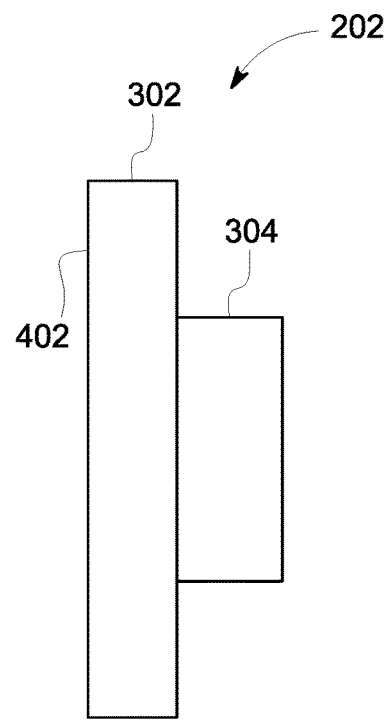
FIG. 4 is a side view of the flange shown in FIG. 3.

FIG. 3 is a top view of flange 202. FIG. 4 is a side view of flange 202. As shown with respect to both figures, flange 202 includes an outer ring portion 302 and an inner ring portion 304. Outer ring portion 302 has a radius R1, and inner ring portion 304 has a radius R2, where R1 is greater than R2. Inner ring portion 304 is coupled to or integral with outer ring portion 302 and extends axially away from outer ring portion 302. Thus, in cross-section, flange 202 is "T" shaped. A plurality of bolt holes, such as bolt holes 306, 308, 310, 312, 314, 316, 318, and 320 are included in outer ring portion 302.

Flange 202 further includes a cylindrical inner surface 301 which defines a cylindrical passage 303 within flange 202. As described in greater detail below, cylindrical passage 303 receives electrically conductive element 206.

Flange 202 further includes a planar mounting surface 402, which receives PCB 204. In the exemplary embodiment, flange 202 is an insulator or has electrically insulating properties. For instance, in some embodiments, flange 202 is fabricated from an FR-4 G10 glass reinforced epoxy laminate.

Figure 5:
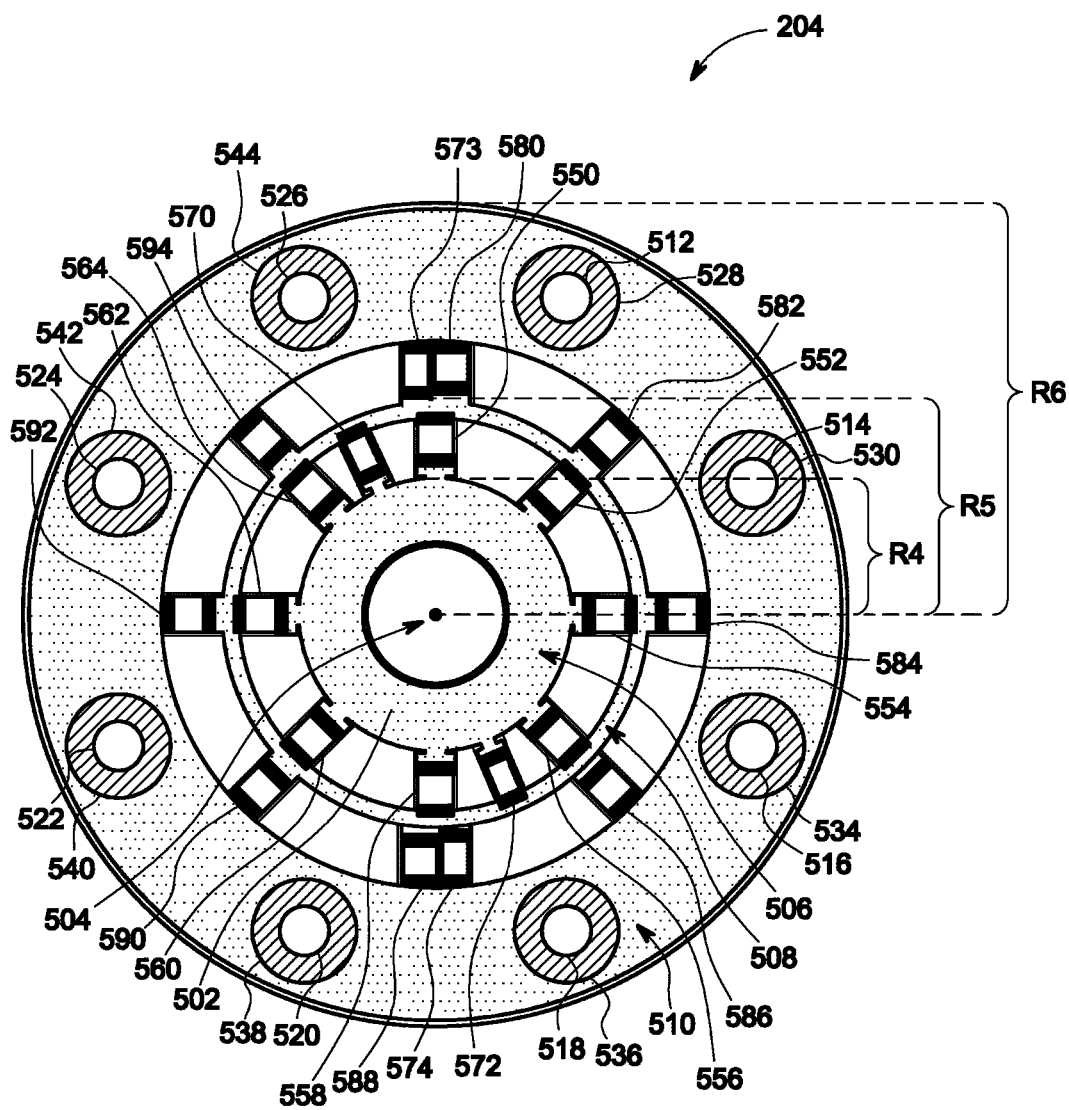
FIG. 5 is a top view of an exemplary printed circuit board shown in the feedthrough of FIG. 2.

FIG. 5 is a top view of PCB 204. In the exemplary embodiment, PCB 204 is ring shaped and has an outer radius R3, which is equal to radius R1 of outer ring portion 302 of flange 202 (shown in FIG. 3). Like flange 202, PCB 204 includes a cylindrical inner surface 502 which defines a cylindrical passage 504 within PCB 204. In addition, like cylindrical passage 303 of flange 202 (shown in FIG. 3), cylindrical passage 504 of PCB 204 receives electrically conductive element 206. This connection is described in greater detail below as well.

PCB 204 further includes a first electrically conductive ring 506, a second electrically conductive ring 508, and a third electrically conductive ring 510. First electrically conductive ring 506 is disposed concentrically within second electrically conductive ring 508, and second electrically conductive ring 508 is, in turn, disposed concentrically within third electrically conductive ring 510. Thus, first electrically conductive ring has a radius R4, second electrically conductive ring has a radius R5, and third electrically conductive ring has a radius R6. Radius R6 is greater than radius R5, and radius R5 is greater than radius R4. Each electrically conductive ring 506, 508, and 510 includes an electrically conductive surface and is fabricated from, for example, silk screened copper on a printed circuit board.

In the exemplary embodiment, third electrically conductive ring 510 includes a plurality of bolt holes, such as bolt holes 512, 514, 516, 518, 520, 522, 524, and 526. In some embodiments, bolt holes 512-526 are surrounded by a ring of exposed copper 528, 530, 534, 536, 538, 540, 542, and 544. Bolt holes 512-526 are machined in PCB 204 to overlap, when PCB 204 is disposed over planar mounting surface 402 of flange 202, with bolt holes 306-320. In some embodiments, PCB 204 is sprayed or otherwise coated with a substance, such as silicone or another environmental spray, to reduce contamination of the surface of PCB 204. Such a coating maintains performance at high voltage. Further, the coating may not be applied to bolt holes 512-526. Similarly, the coating may not, in some embodiments, be applied to cylindrical conductive passage 504 and/or first electrically conductive ring 506 on PCB 204.

In the exemplary embodiment, a first plurality capacitors, such as capacitors 550, 552, 554, 556, 558, 560, 562, and 564, are mounted on PCB 204. For instance, capacitors 550-564 are mounted on PCB 204 between first electrically conductive ring 506 and second electrically conductive ring 508. Capacitors 550-564 are electrically coupled in parallel. Thus, capacitors 550-564 form an electrical connection between first electrically conductive ring 506 and second electrically conductive ring 508. More particularly, capacitors 550-564 form an electrical connection between first electrically conductive ring 506 and second electrically conductive ring 508 that acts as a low impedance circuit to high frequency current and as an high impedance circuit to lower frequency current, such as, for example, low frequency alternating current and direct current. Capacitors 550-564 are selected to filter or reduce noise exceeding a particular frequency. Capacitors 550-564 include any suitable type of capacitor, including, for example, "Y" capacitors. One or more resistors, such as resistors 570 and 572, are also mounted on PCB 204 between first electrically conductive ring 506 and second electrically conductive ring 508. Resistors 570 and 572 are coupled in parallel and act as voltage balancing resistors.

A second plurality of capacitors, such as capacitors 580, 582, 584, 586, 588, 590, 592, and 594, are mounted on PCB 204. For instance, capacitors 580-594 are mounted on PCB 204 between second electrically conductive ring 508 and third electrically conductive ring 510. Capacitors 580-594 are electrically coupled in parallel. Thus, capacitors 580-594 form an electrical connection between second electrically conductive ring 508 and third electrically conductive ring 510. More particularly, capacitors 580-594 form an electrical connection between second electrically conductive ring 508 and third electrically conductive ring 510 that acts as a low impedance circuit to high frequency current and as an high impedance circuit to lower frequency current, such as low frequency alternating current and direct current. Capacitors 580-594 are selected to filter or reduce noise exceeding a particular frequency. Capacitors 580-594 include any suitable type of capacitor, including, for example, "Y" capacitors. One or more resistors, such as resistors 573 and 574, are also mounted on PCB 204 between second electrically conductive ring 508 and third electrically conductive ring 510. Resistors 573 and 574 are electrically coupled in parallel and act as voltage balancing resistors.

Figure 6:
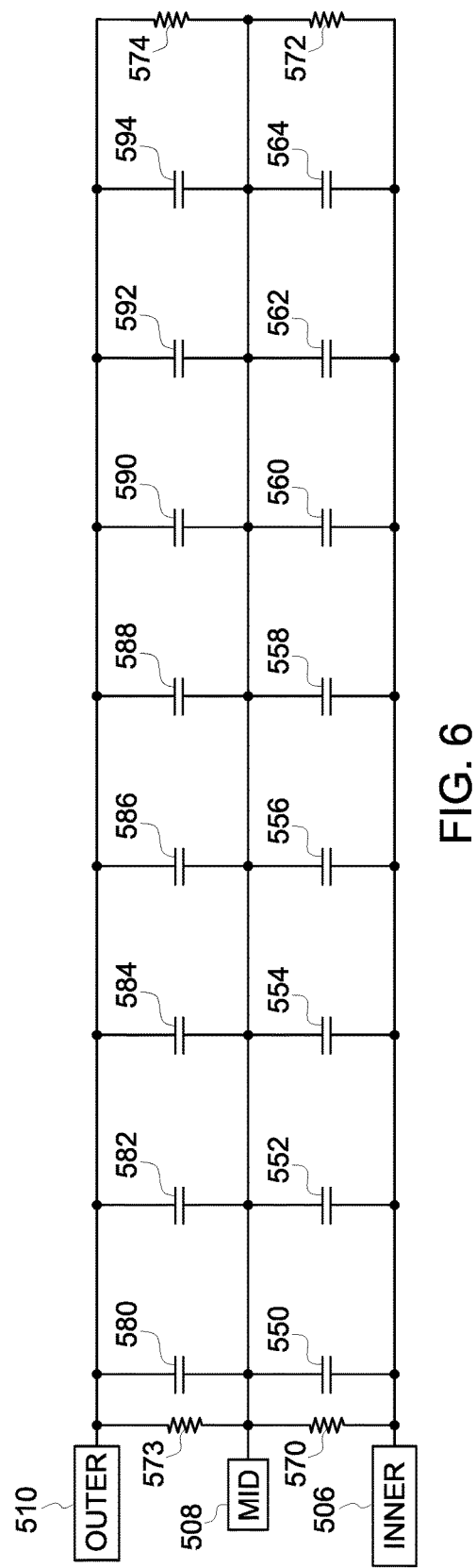
FIG. 6 is a circuit schematic of the printed circuit board shown in FIG. 5.

FIG. 6 is a circuit schematic of PCB 204 (as shown at FIG. 5). Accordingly, capacitors 550-564 are electrically coupled in series with capacitors 580-594. More particularly, each capacitor 550-564 is electrically coupled in series with a corresponding one of capacitors 580-594. For example, capacitor 550 is electrically coupled in series with capacitor 580, while capacitor 552 is electrically coupled in series with capacitor 582. Capacitor 554 is electrically coupled in series with capacitor 584, capacitor 556 is electrically coupled in series with capacitor 586, capacitor 558 is electrically coupled in series with capacitor 588, capacitor 560 is electrically coupled in series with capacitor 590, capacitor 562 is electrically coupled in series with capacitor 592, and capacitor 564 is electrically coupled in series with capacitor 594. Similarly, resistor 570 is electrically coupled in series with resistor 573, while resistor 572 is electrically coupled in series with resistor 574. As described in greater detail below, such a concentric pattern of capacitors 550-564 and 580-594 creates a low impedance conducting path for high frequency alternating current.

Although PCB 204 is described above with reference to first, second, and third electrically conductive rings 506, 508, and 510, in some embodiments, a greater number or fewer number of electrically conductive rings are implemented. Further, although PCB 204 is described with reference to first plurality of capacitors 550-564 and second plurality of capacitors 580-594, in some embodiments, a greater or fewer number of capacitors are coupled between each ring. For example, PCB 204 may include a single plurality of capacitors, such as capacitors 550-564 coupled between first electrically conductive ring 506 and second electrically conductive ring 508. Similarly, additional capacitors may be coupled between additional electrically conductive rings. The number of electrically conductive rings and capacitors coupled therebetween may be varied to adjust the voltage handling capacity of PCB 204. Feedthrough 200 is thus scalable to handle greater and/or lesser voltages.

With returning reference to FIG. 2, feedthrough 200 is mounted on and coupled through cabinet 106. More particularly, one or more fasteners are used to mount feedthrough 200 to cabinet 106. In the exemplary embodiment, eight fasteners are used, and each fastener is inserted through one of bolt holes 306-320 in flange 202 and one of bolt holes 512-526 in PCB 204. In the cross-section shown at FIG. 2, a first fastener 212 and a second fastener 214 are shown. One or more fasteners, including first fastener 212 and second fastener 214, are fabricated from any metallic or electrically conductive material and are any suitable fastener, such as any suitable screw or any suitable bolt. Each fastener 212 and 214 is, in some embodiments, secured through cabinet 106 by a retaining nut, such as a retaining nut 240 and a retaining nut 242.

Electrically conductive element 206 is fabricated from any suitable electrically conductive material, such as, for example, brass, copper, aluminum, or steel. In some embodiments, electrically conductive element 206 is further threaded to receive one or more nuts, such as nuts 216, 220, 224, 228, 232, and 234. Thus, in one embodiment, electrically conductive element 206 is a threaded brass rod. Like electrically conductive element 206, nuts 216-234 are fabricated from any suitable electrically conductive material, such as, for example, brass, copper, aluminum, or steel. As described below, the diameter or thickness of electrically conductive element 206 may be varied depending upon the desired current handling capacity of feedthrough 200. For example, the diameter of electrically conductive element 206 may be increased to increase the amount of current that feedthrough 200 is able to conduct, and the diameter of electrically conductive element 206 may be decreased to decrease the amount of current that feedthrough 200 is able to conduct. Thus, in the exemplary embodiment, electrically conductive element 206 has a diameter in the range of 1-50 millimeters (mm.)

In the exemplary embodiment, nuts 216-234 are threaded over electrically conductive element 206 and tightened to secure electrically conductive element 206 within flange 202. As shown at FIG. 2, nuts 216-234 further secure PCB 204 against planar mounting surface 402 of flange 202. Where electrically conductive element 206 includes threads, an electrical contact lubricant or grease, such as NO-OX-ID A-special electrical contact grease is used.

Thus, in the exemplary embodiment, once assembled, feedthrough 200 includes electrically conductive element 206 inserted through flange 202 and PCB 204 and electrically connecting to cabinet 106 by a plurality of fasteners, such as fasteners 212 and 214, passed through bolt holes 306-320 in flange 202 and through bolt holes 512-526 in PCB 204.

Electrically conductive element 206 makes electrical contact with first electrically conductive ring 506 of PCB 204, which, as described above, makes electrical contact, through capacitors 550-564, with second electrically conductive ring 508. In other words, electrically conductive element 206 is in electrical contact with first electrically conductive ring 506. Second electrically conductive ring 508 makes electrical contact, through capacitors 580-594, with third electrically conductive ring 510, and third electrically conductive ring 510 makes electrical contact with each electrically conductive fastener, such as fasteners 212 and 214, inserted through bolt holes 512-526, which make electrical contact, in turn, with cabinet 106. Thus, feedthrough 200 is constructed and installed, such that a path to ground is formed between electrically conductive element 206 and cabinet 106 through PCB 204.

However, the path to ground is only available to high frequency alternating current, because capacitors 550-564 and 580-594 function as low impedance circuits to high frequency alternating current and as high impedance circuits to low frequency alternating current and direct current. More particularly, high frequency alternating current, such as high frequency noise, generated as a byproduct of the DC-to-AC power conversion process performed by power inverter 104 is shunted or conducted to ground through PCB 204, whereas low frequency alternating current and direct current generated by power source 102 is unable to flow from first electrically conductive ring 506 of PCB to second electrically conductive ring 508 of PCB.

Feedthrough 200 therefore functions to pass low frequency alternating current and direct current from power source 102 to power inverter 104 and prevents the introduction of high frequency alternating current on power line 116 and/or power line 122 produced by the fast switching semiconductor components of power inverter 104. Power line 116 and/or power line 122 are not easily able to radiate, at least in the RF part of the electromagnetic frequency spectrum, as antenna transmitters. In various embodiments, power line 116 and/or power line 122 are not easily able to radiate, depending upon capacitances selected for each of capacitors 550-564 and/or 580-594, in various parts of the electromagnetic frequency spectrum, including all portions of the spectrum. In other words, feedthrough 200 permits the flow of low frequency alternating current and direct current through cabinet 106 but filters or reduces the flow of high frequency alternating current generated by power inverter 104 that would otherwise flow onto power line 116 and/or power line 122 and that would cause power line 116 and/or power line 122 to act as an unintentional antenna transmitter.

With two stages of capacitors 550-564 and 580-594, as in some embodiments, feedthrough 200 is suitable to conduct low frequency alternating current and direct current, such as low frequency alternating and direct current having a voltage from 0 volts up to approximately 4000 volts. Similarly, where electrically conductive element 206 is a brass rod having a thickness of 0.46 inches ("in.") or 1.17 centimeters ("cm."), feedthrough 200 is able to conduct low frequency alternating current and direct current, such as low frequency alternating and direct current having an amperage from 0 amps up to approximately 1000 amps. As described above, greater or fewer numbers of capacitors may be introduced to increase the voltage handling capacity of feedthrough 200. Similarly, the thickness of electrically conductive element 206 may be increased or decreased to adjust the current handling capacity of feedthrough 200.

Embodiments of the electrical power generation system, as described above, facilitate the transmission of electrical power from a power source, such as a PV array, through a feedthrough, and to a power inverter. Embodiments further discourage or limit the introduction of high frequency alternating current on a power line used to transmit electrical power from the power source to the feedthrough. Rather, high frequency alternating current, or noise, is shunted to ground through a plurality of capacitors mounted on a PCB of the feedthrough. Thus, the feedthrough limits the flow of high frequency noise onto the power line connecting the feedthrough to the PV array, and, in turn, reducing radiation from the power line in the RF part of the electromagnetic spectrum as an unintentional antenna transmitter.

Exemplary technical effects of the electrical power generation system described herein include, for example: (a) transmitting low frequency alternating current and direct current from a power source, through a feedthrough coupled to a cabinet, to a power inverter; (b) limiting or reducing noise generated by the power inverter on the power line connecting the power source to the feedthrough; and (c) conducting high voltage low frequency alternating current and direct current as well as high amperage low frequency alternating current and direct current, such as up to 4000 volts and 1000 amps.

Exemplary embodiments of an electrical power generation system and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where compressing a fluid is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:
1. A feedthrough comprising:
an electrically insulating flange comprising an inner cylindrical surface, said inner cylindrical surface defining a cylindrical passage, said flange further comprising a planar mounting surface;
a printed circuit board mounted on said planar mounting surface; and
an electrically conductive element, said electrically conductive element extending through the cylindrical passage;
wherein said printed circuit board comprises a first electrically conductive ring having a first radius, a second electrically conductive ring having a second radius that is greater than the first radius, and a third electrically conductive ring having a third radius that is greater than the second radius.

2. The feedthrough of claim 1, wherein said printed circuit board further comprises a first plurality of capacitors electrically coupled between said first electrically conductive ring and said second electrically conductive ring.

3. The feedthrough of claim 2, wherein said printed circuit board further comprises a second plurality of capacitors electrically coupled between said second electrically conductive ring and said third electrically conductive ring.

4. The feedthrough of claim 3, wherein said first electrically conductive ring is configured to conduct an electrical current through said first plurality of capacitors to said second electrically conductive ring and through said second plurality of capacitors to said third electrically conductive ring.

5. The feedthrough of claim 4, wherein said third electrically conductive ring is configured to conduct the current to ground.

6. The feedthrough of claim 4, wherein said third electrically conductive ring conducts the current through a plurality of bolts to ground.

7. The feedthrough of claim 3, wherein each capacitor of said first plurality of capacitors is electrically coupled in series to a corresponding capacitor of said second plurality of capacitors.

8. The feedthrough of claim 3, wherein said first plurality of capacitors are electrically coupled to one another in parallel, and wherein said second plurality of capacitors are electrically coupled to one another in parallel.

9. The feedthrough of claim 1, wherein said printed circuit board conducts an alternating current flowing over said electrically conductive element to ground.

10. The feedthrough of claim 1, wherein said printed circuit board further defines a plurality of bolt holes.

11. The feedthrough of claim 1, wherein said printed circuit board further comprises a plurality of voltage balancing resistors.

12. The feedthrough of claim 1, wherein said elongated electrically conductive element is electrically connected to said first electrically conductive ring.

13. The feedthrough of claim 1, wherein said printed circuit board comprises a plurality of concentric electrically conductive rings, each ring of the plurality of concentric electrically conductive rings electrically connected to a concentrically adjacent ring by at least one capacitor.

14. The feedthrough of claim 1, wherein said flange comprises an electrically insulating material.

15. The feedthrough of claim 1, further comprising a plurality of nuts, said plurality of nuts threaded over said electrically conductive element and securing said electrically conductive element within said cylindrical passage of said flange.

16. The feedthrough of claim 1, further comprising a plurality of nuts, said plurality of nuts threaded over said electrically conductive element and securing said printed circuit board to said planar mounting surface of said flange.

17. The feedthrough of claim 1, wherein said electrically conductive element has a diameter in the range of 1 to 50 millimeters.

18. The feedthrough of claim 1, wherein said printed circuit board further defines a plurality of bolt holes and a cylindrical passage, and wherein said printed circuit board is coated with an environmental spray, and wherein said plurality of bolt holes and said inner conductive ring are not coated with the environmental spray.

19. An electrical power generation system comprising:
   a power source;
   a power line coupled to said power source; a housing;
   a power inverter mounted within said housing; and
   a feedthrough passing through said housing and electrically coupling said power line to said power inverter, said feedthrough comprising:
      a flange comprising an inner cylindrical surface, said inner cylindrical surface defining a cylindrical passage, said flange further comprising a planar mounting surface;
      a printed circuit board mounted on said planar mounting surface; and
      an electrically conductive element extending through the cylindrical passage;
      wherein said printed circuit board comprises a first electrically conductive ring having a first radius, a second electrically conductive ring having a second radius that is greater than the first radius, and a third electrically conductive ring having a third radius that is greater than the second radius.

20. A printed circuit board for use as part of a feedthrough, said printed circuit board comprising:
   a first electrically conductive ring having a first radius;
   a second electrically conductive ring having a second radius that is greater than the first radius;
   a third electrically conductive ring having a third radius that is greater than the second radius;
   a first plurality of capacitors electrically coupled between said first electrically conductive ring and said second electrically conductive ring; and
   a second plurality of capacitors electrically coupled between said second electrically conductive ring and said third electrically conductive ring.

* * * * *